United States Patent
Wang et al.

(10) Patent No.: US 10,090,217 B2
(45) Date of Patent: Oct. 2, 2018

(54) CHIP PACKAGING METHOD AND PACKAGE STRUCTURE

(71) Applicant: China Wafer Level CSP Co., Ltd., Suzhou, Jiangsu (CN)

(72) Inventors: Zhiqi Wang, Suzhou (CN); Qiong Yu, Suzhou (CN); Wei Wang, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/509,602

(22) PCT Filed: Sep. 10, 2015

(86) PCT No.: PCT/CN2015/089304
§ 371 (c)(1),
(2) Date: Mar. 8, 2017

(87) PCT Pub. No.: WO2016/037574
PCT Pub. Date: Mar. 17, 2016

(65) Prior Publication Data
US 2017/0287797 A1     Oct. 5, 2017

(30) Foreign Application Priority Data
Sep. 12, 2014     (CN) .......................... 2014 1 0465882

(51) Int. Cl.
*H01L 23/48*     (2006.01)
*H01L 23/08*     (2006.01)
(Continued)

(52) U.S. Cl.
CPC .............. *H01L 23/08* (2013.01); *H01L 23/04* (2013.01); *H01L 23/293* (2013.01);
(Continued)

(58) Field of Classification Search
CPC ... H01L 23/08; H01L 23/04; H01L 23/49811; H01L 24/19; H01L 23/5389;
(Continued)

(56) References Cited

U.S. PATENT DOCUMENTS 9,190,379 B2 *  11/2015  Arnold .................... H01L 24/19
2004/0188838 A1  9/2004  Okada et al.
(Continued)

FOREIGN PATENT DOCUMENTS

CN     1533741 A     10/2004
CN   101047153 A     10/2007
(Continued)

OTHER PUBLICATIONS

International Search Report for PCT/CN2015/089304, dated Nov. 25, 2015.

*Primary Examiner* — Thinh T Nguyen
(74) *Attorney, Agent, or Firm* — Wolf, Greenfield & Sacks, P.C.

(57) ABSTRACT

A chip packaging method and package structure, the package structure including a substrate, a sensing chip coupled to the substrate, a plastic package layer located on the substrate, and a covering layer located on the plastic package layer and a first surface of the sensing chip; the sensing chip including the first surface and a second surface opposite to the first surface, and further including a sensing area located on the first surface; the second surface of the sensing chip faces towards the substrate; and the plastic package layer encloses the sensing chip, and the surface of the plastic package layer is flush with the first surface of the sensing chip.

16 Claims, 4 Drawing Sheets

(51) Int. Cl.
*H01L 23/04* (2006.01)
*H01L 23/498* (2006.01)
*H01L 23/58* (2006.01)
*H01L 23/29* (2006.01)
*G06K 9/00* (2006.01)
*H01L 23/31* (2006.01)
*H01L 23/00* (2006.01)

(52) U.S. Cl.
CPC ...... *H01L 23/49811* (2013.01); *H01L 23/585* (2013.01); *G06K 9/0002* (2013.01); *H01L 23/3128* (2013.01); *H01L 24/19* (2013.01); *H01L 2924/00* (2013.01)

(58) Field of Classification Search
CPC . H01L 23/585; H01L 23/293; H01L 23/3121; H01L 23/3128; H01L 2924/00; H01L 2924/12042
USPC .............. 257/692, 687, 704, 730, 680, 678; 438/106, 116, 121
See application file for complete search history.

(56) References Cited

U.S. PATENT DOCUMENTS

| | | | |
|---|---|---|---|
| 2007/0086630 A1* | 4/2007 | Setlak | G06K 9/00053 382/124 |
| 2008/0296716 A1 | 12/2008 | Chan et al. | |
| 2009/0051052 A1 | 2/2009 | Yoshioka et al. | |
| 2009/0283845 A1 | 11/2009 | Chou | |
| 2011/0156240 A1* | 6/2011 | Luan | H01L 24/19 257/692 |
| 2011/0309482 A1 | 12/2011 | Salatino et al. | |
| 2012/0313252 A1 | 12/2012 | Ueda et al. | |
| 2013/0069176 A1* | 3/2013 | Daamen | H01L 23/315 257/414 |
| 2013/0154076 A1 | 6/2013 | Camacho et al. | |
| 2013/0307818 A1* | 11/2013 | Pope | G06F 3/044 345/174 |
| 2014/0084425 A1* | 3/2014 | Arnold | H01L 24/19 257/620 |
| 2017/0140195 A1* | 5/2017 | Wang | G06K 9/0002 |
| 2017/0147851 A1* | 5/2017 | Wang | G06K 9/0002 |

FOREIGN PATENT DOCUMENTS

| | | |
|---|---|---|
| CN | 101188202 A | 5/2008 |
| CN | 103038782 A | 4/2013 |
| CN | 103715149 A | 4/2014 |
| CN | 203521394 U | 4/2014 |
| CN | 103793689 A | 5/2014 |
| CN | 104201116 A | 12/2014 |
| CN | 204179070 U | 2/2015 |
| CN | 104600055 A | 5/2015 |
| CN | 104850840 A | 8/2015 |
| WO | WO 2016/037574 A1 | 3/2016 |

* cited by examiner

CHIP PACKAGING METHOD AND PACKAGE STRUCTURE

CROSS REFERENCE TO RELATED APPLICATION

This application is the national phase of International Application No. PCT/CN2015/089304 titled "CHIP PACKAGING METHOD AND PACKAGE STRUCTURE", filed on Sep. 10, 2015, which claims priority to Chinese Patent Application No. 201410465882.9, titled "FINGERPRINT IDENTIFICATION CHIP PACKAGING METHOD AND FINGERPRINT IDENTIFICATION CHIP PACKAGING STRUCTURE", filed on Sep. 12, 2014 with the State Intellectual Property Office of the People's Republic of China, both of which applications are incorporated herein by reference to the maximum extent allowable.

TECHNICAL FIELD

The present disclosure relates to the technical field of semiconductor manufacture, and in particular to a chip packaging method and a package structure.

BACKGROUND

With the progress of modern society, significance of personal identity identification and personal information security has been paid increasing attention. Due to uniqueness and invariance of human fingerprints, fingerprint recognition technology has high security and reliability, is simple and convenient to use, and is widely applied to various fields of personal information security protection. With the continuous developments of science and technology, information security of various electronic products is always one of the focuses of technology development. Especially for mobile terminals such as a mobile phone, a laptop computer, a tablet computer and a digital camera, a requirement for information security is more urgent.

A fingerprint recognition device may senses in a capacitive (electrical field) manner or in an inductive manner. The fingerprint recognition device obtains fingerprint information of a user by extracting a fingerprint of the user and converting the fingerprint of the user into an electrical signal for outputting. Specifically, reference is made to FIG. 1, which is a sectional view of a fingerprint recognition device. The fingerprint recognition device includes a substrate 100, a fingerprint recognition chip 101 coupled to a surface of the substrate 100, and a glass substrate 102 covering a surface of the fingerprint recognition chip 101.

A capacitive fingerprint recognition chip is taken as an example. The fingerprint recognition chip 101 includes one or more capacitor plates. An epidermis or a subcutaneous layer of a user finger includes convex ridges and concave valleys, and distances between the ridges and the fingerprint recognition chip 101 are different from those between the valleys and the fingerprint recognition chip 101 when the user finger 103 touches a surface of the glass substrate 102. Therefore, capacitances between the ridges of the user finger 103 and the capacitor plates are different from those between the valleys of the user finger 103 and the capacitor plates. The fingerprint recognition chip 101 can obtain the different capacitances, convert the capacitances into corresponding electrical signals and output the electrical signals. The fingerprint recognition device can obtain fingerprint information of the user after collecting the received electrical signals.

In practice, a conventional fingerprint recognition device has a high requirement for sensitivity of a fingerprint recognition chip, which limits manufacture and application of the fingerprint recognition device.

SUMMARY

Embodiments of the present disclosure aim to simplify a packaging method for a fingerprint identification chip, simplify a package structure for the fingerprint identification chip formed by the packaging method, reduce the requirement for the sensitivity of a sensing chip, and make the packaging method and the package structure widely used.

In view of the above, a packaging method for a fingerprint identification chip is provided according to an embodiment of the present disclosure. The packaging method includes: providing a substrate; coupling a sensing chip to the substrate, where the sensing chip includes a first surface and a second surface opposite to the first surface, the sensing chip further includes a sensing region located on the first surface, and the second surface of the sensing chip faces the substrate; forming a plastic packaging layer on the substrate, where the surface of the plastic packaging layer is flush with the first surface of the sensing chip; and forming a cover layer on the plastic packaging layer and the first surface of the sensing chip.

Optionally, the thickness of the cover layer is less than or equal to 100 microns.

Optionally, the thickness of the cover layer ranges from 20 microns to 100 microns. The Mohs hardness of the cover layer is greater than or equal to 8H. The dielectric constant of the cover layer is greater than or equal to 7.

Optionally, the cover layer is made of at least one of an inorganic nanometer material or a polymer material.

Optionally, the cover layer is formed by a screen printing process, a spin coating process, or a spraying coating process.

Optionally, the polymer material includes at least one of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer and polyvinyl alcohol.

Optionally, the inorganic nanometer material is aluminium oxide and/or cobalt oxide.

Optionally, the cover layer is formed by a chemical vapor deposition process, a physical vapor deposition process, an atomic layer deposition process, a screen printing process, a spin coating process, or a spray coating process.

Optionally, the color of the cover layer includes black and/or white.

Optionally, the plastic packaging layer is made of polymer.

Optionally, the plastic packaging layer is formed by a transfer injecting process, a screen printing process, a spin coating process, or a spray coating process.

Optionally, the sensing chip further includes a peripheral region located on the first surface and surrounding the sensing region.

Optionally, the packaging method for a fingerprint identification chip further includes forming an edge groove in the peripheral region of the sensing chip before forming the plastic packaging layer. The edge groove is exposed on a side surface of the sensing chip; and forming a chip circuit on the surface of the peripheral region and on the side wall and the bottom surface of the edge groove.

Optionally, the edge groove includes a continuous groove, or several discrete grooves surrounding the sensing region.

Optionally, the plastic packaging layer is further formed in the edge groove, and is flush with the surface of the sensing region of the sensing chip.

Optionally, the packaging method for a fingerprint identification chip further includes forming a first pad at the bottom of the edge groove. The chip circuit is electrically connected to the first pad.

Optionally, the substrate includes a first side surface. The sensing chip is coupled to the first side surface of the substrate, and the first side surface of the substrate is provided with a second pad.

Optionally, the packaging method for a fingerprint identification chip further includes forming a conductive wire before forming the plastic packaging layer. Two ends of the conductive wire are connected to the first pad and the second pad respectively.

Optionally, a point on the conductive wire whose distance to the first side surface of the substrate is maximal is an apex. The apex is lower than the surface of the plastic packaging layer.

Optionally, the packaging method for a fingerprint identification chip further includes forming a conductive layer on the surface of the side wall of the sensing chip, on the first side surface of the substrate, and in the edge groove. Two ends of the conductive layer are respectively connected to the first pad and the second pad.

Optionally, the packaging method for a fingerprint identification chip further includes: forming a first adhesive layer on a first side surface of the substrate or on a second surface of the sensing chip before coupling the sensing chip to the substrate; and fixing the sensing chip to the first side surface of the substrate via the first adhesive layer.

Optionally, the packaging method for a fingerprint identification chip further includes: forming a second adhesive layer on the plastic packaging layer and the first surface of the sensing chip; and forming the cover layer on the surface of the second adhesive layer.

Optionally, the cover layer is a glass substrate, and the glass substrate has a dielectric constant ranging from 6 to 10 and a thickness ranging from 100 microns to 300 microns. Alternatively, the cover layer is a ceramic substrate, and the ceramic substrate has a dielectric constant ranging from 20 to 100 and a thickness ranging from 100 microns to 200 microns.

Optionally, a color of the second adhesive layer includes black and/or white.

Optionally, a color layer is formed on the surface of the second adhesive layer. The cover layer is formed on a surface of the color layer. A color of the color layer includes black and/or white.

Optionally, the packaging method for a fingerprint identification chip further includes forming a guard ring on the substrate. The guard ring surrounds the sensing chip, the packaging layer and the cover layer, and a part of the cover layer on the sensing region is exposed from the guard ring.

Optionally, the packaging method for a fingerprint identification chip further includes forming a housing surrounding the plastic packaging layer, the sensing chip, the cover layer, and the guard ring. A part of the cover layer on the sensing region is exposed from the housing.

Optionally, the packaging method for a fingerprint identification chip further includes forming a housing surrounding the plastic packaging layer, the sensing chip and the cover layer. A part of the cover layer on the sensing region is exposed from the housing.

Optionally, a connection portion is formed at one end of the substrate, and the connection portion is configured to make the sensing chip electrically connected to an external circuit.

A package structure for a fingerprint identification chip is provided according to an embodiment of the present disclosure. The package structure includes a substrate, a sensing chip coupled to the substrate, a plastic packaging layer located on the substrate, and a cover layer located on the plastic packaging layer and on the first surface of the sensing chip. The sensing chip includes a first surface and a second surface opposite to the first surface. The sensing chip further includes a sensing region located on the first surface, and the second surface of the sensing chip faces the substrate. The surface of the plastic packaging layer is flush with the first surface of the sensing chip. Optionally, the sensing chip further includes a peripheral region located on the first surface and surrounding the sensing region.

Optionally, the sensing chip further includes an edge groove located in the peripheral region, and a chip circuit located on the surface of the peripheral region and on the side wall and the bottom surface of the edge groove. The edge groove is exposed on a side surface of the sensing chip.

Optionally, the edge groove includes a continuous groove, or several discrete grooves surrounding the sensing region.

Optionally, the plastic packaging layer is further located in the edge groove, and is flush with the surface of the sensing region of the sensing chip.

Optionally, the package structure for a fingerprint identification chip further includes a first pad located at the bottom of the edge groove. The chip circuit is connected to the first pad.

Optionally, the substrate includes a first side surface. The sensing chip is coupled to the first side surface of the substrate, and the first side surface of the substrate is provided with a second pad.

Optionally, the package structure for a fingerprint identification chip further includes a conductive wire. Two ends of the conductive wire are connected to the first pad and the second pad respectively.

Optionally, a point on the conductive wire whose distance to the first side surface of the substrate is maximal is an apex. The apex is lower than the surface of the plastic packaging layer.

Optionally, the package structure for a fingerprint identification chip further includes a conductive layer located on the surface of the side wall of the sensing chip, on the first side surface of the substrate, and in the edge groove. Two ends of the conductive layer are respectively connected to the first pad and the second pad.

Optionally, the package structure for a fingerprint identification chip further includes a first adhesive layer located between the sensing chip and the substrate.

Optionally, the thickness of the cover layer ranges from 20 microns to 100 microns. The Mohs hardness of the cover layer is greater than or equal to 8H. The dielectric constant of the cover layer is greater than or equal to 7. The cover layer is made of at least one of an inorganic nanometer material and/or a polymer material. The polymer material includes at least one of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer and polyvinyl alcohol. The inorganic nanometer material includes aluminium oxide and/or cobalt oxide. The color of the cover layer includes black and/or white.

Optionally, a second adhesive layer is located between the cover layer and the plastic packaging layer, and between the cover layer and the first surface of the sensing chip.

Optionally, the cover layer is a glass substrate, and the glass substrate has a dielectric constant ranging from 6 to 10 and a thickness ranging from 100 microns to 300 microns. Alternatively, the cover layer is a ceramic substrate, and the ceramic substrate has a dielectric constant ranging from 20 to 100 and a thickness ranging from 100 microns to 200 microns.

Optionally, a color of the second adhesive layer includes black and/or white.

Optionally, a color layer is located on the surface of the second adhesive layer. The cover layer is located on the surface of the color layer. A color of the color layer includes black and/or white.

Optionally, the package structure for a fingerprint identification chip further includes a guard ring located on the substrate. The guard ring surrounds the sensing chip, the plastic packaging layer and the cover layer, and a part of the cover layer on the sensing region is exposed from the guard ring.

Optionally, the package structure for a fingerprint identification chip further includes a housing surrounding the plastic packaging layer, the sensing chip, the cover layer and the guard ring. A part of the cover layer on the sensing region is exposed from the housing.

Optionally, the package structure for a fingerprint identification chip further includes a housing surrounding the plastic packaging layer, the sensing chip and the cover layer. A part of the cover layer on the sensing region is exposed from the housing.

Optionally, one end of the substrate is provided with a connection portion, and the connection portion is configured to electrically connect the sensing chip to an external circuit.

DETAILED DESCRIPTION OF THE EMBODIMENTS

As described in the background, a conventional fingerprint recognition device has a high requirement for sensitivity of a fingerprint recognition chip, thus the manufacture and application of the fingerprint recognition device are limited.

Figure 1:
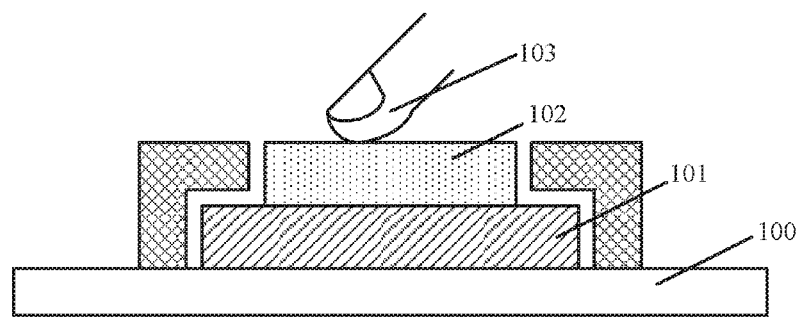
FIG. 1 is a sectional view of a fingerprint recognition device.

The following is discovered through researches. Reference is made to FIG. 1. A surface of a fingerprint recognition chip 101 is covered with a glass substrate 102. The glass substrate 102 is configured to protect the fingerprint recognition chip 101. Since a user finger 103 touches the glass substrate 102 directly, the glass substrate 102 is thick such that the glass substrate 102 has sufficient protection capability. However, since the glass substrate 102 is thick, the fingerprint recognition chip 101 is required to have a high sensitivity to accurately extract a fingerprint of the user. A fingerprint recognition chip with a high sensitivity is difficult to manufacture and has a high manufacture cost, thus the manufacture and application of the fingerprint recognition chip are limited.

Specifically, a capacitive fingerprint recognition device is taken as an example. When the user finger 103 is put on a surface of the glass substrate 102, a capacitor is formed between the user finger 103 and a capacitor plate in the fingerprint recognition chip 101. The user finger 103 and the capacitor plate are two electrodes of the capacitor, and the glass substrate 102 is a dielectric between the two electrodes of the capacitor. However, since the glass substrate 102 is thick, a capacitance between the user finger 103 and the capacitor plate is large. A difference between a height of a ridge and a height of a valley of the user finger 103 is small, and hence, a capacitance between the ridge and the capacitor plate differs slightly from a capacitance between the valley and the capacitor plate. In order to accurately detect the difference between the capacitances, the fingerprint recognition chip 101 is required to have a high sensitivity.

In view of the above, a packaging method and a package structure for a fingerprint identification chip are provided in the present disclosure. In the packaging method, the surface of a plastic packaging layer formed on a substrate is flush with a first surface of a sensing chip (for example, a fingerprint identification chip), and the plastic packaging layer is configured to protect the sensing chip and electrically isolate the sensing chip from the external environment. Since the surface of the plastic packaging layer is flush with the first surface of the sensing chip, a cover layer can be directly formed on the plastic packaging layer and the first surface of sensing chip without an additional patterning process on the cover layer. In such a way, the process of forming the cover layer is simplified, and unwanted damage to a sensing region of the sensing chip in the process of forming the cover layer can be avoided, thus fingerprint data obtained by the sensing region is accurate. The cover layer replaces the conventional glass substrate and can be touched by a user finger directly to protect the sensing chip. In addition, the cover layer can be thinner than conventional glass substrates, and the use of the cover layer can reduce a distance from the first surface of the sensing chip to a surface of the cover layer, thus it is easy for the sensing chip to detect a user fingerprint. Accordingly, the package structure reduces the requirement for sensitivity of a sensing chip, and the package structure for a fingerprint identification chip is widely used.

For a better understanding of the object, features and advantages of the present disclosure, embodiments of the present disclosure are described in detail hereinafter in conjunction with drawings.

FIG. 2 to FIG. 6 are sectional views showing the forming of a package structure for a fingerprint identification chip according to embodiments of the present disclosure.

Figure 2:
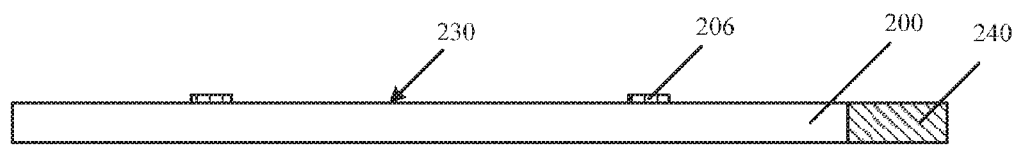
FIG. 2 to FIG. 6 are sectional views showing the forming of a package structure for a fingerprint identification chip according to embodiments of the present disclosure.

Reference is made to FIG. 2. A substrate 200 is provided.

The substrate 200 is a rigid substrate or a flexible substrate, and may be adjusted for a device or a terminal in which a sensing chip 201 is to be arranged. In the embodiment, the substrate 200 is a rigid substrate. The rigid substrate is a PCB substrate, a glass substrate, a metal substrate, a semiconductor substrate or a polymer substrate.

In the embodiment, the substrate 200 includes a first side surface 230 configured to couple the sensing chip. The first side surface 230 of the substrate 200 is provided with a wiring layer (not shown) and a second pad 206. The wiring layer is connected to the second pad 206, and the second pad 206 is configured to be connected to a chip circuit on the surface of the sensing chip.

In the embodiment, a connection portion 204 is formed at one end of the substrate 200. The connection portion 204 is configured to electrically connect the sensing chip to an external circuit. The connection portion 204 may be made of a conductive material. The connection portion 204 is electrically connected to the wiring layer, so that the chip circuit on the sensing chip may be electrically connected to the external circuit or a external device via the wiring layer on the first side surface 230 of the substrate 200 and via the connection portion 204, thereby achieving transmission of an electrical signal.

Figure 3:
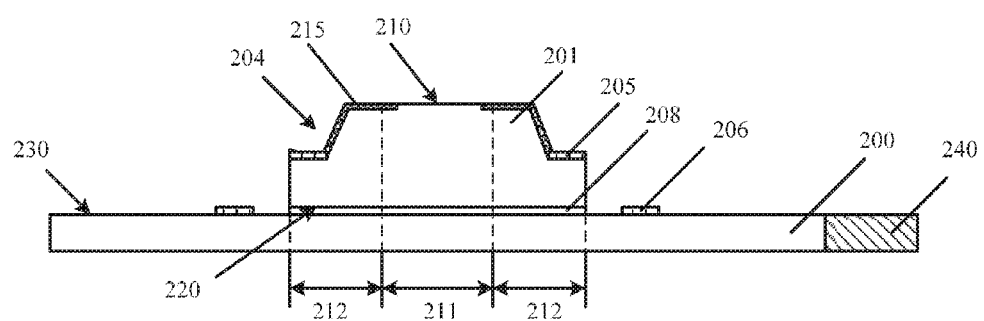

Reference is made to FIG. 3. A sensing chip 201 is fixed on the substrate 200. The sensing chip 201 includes a first surface 210 and a second surface 220 opposite to the first surface 210. The sensing chip 201 further includes a sensing region 211 located on the first surface 210, and the second surface 220 of the sensing chip 201 faces the substrate 200.

In the embodiment, a first adhesive layer 208 is adhered to the second surface 220 of the sensing chip 201, and to the first side surface 230 of the substrate 200, so that the sensing chip 201 is fixed on the first side surface 230 of the substrate 200. The sensing chip 201 can be coupled to the substrate 200 by a wire bonding process, i.e., the sensing chip 201 is electrically connected to the wiring layer of the substrate 200.

In another embodiment, the first adhesive layer 208 may also be formed at a corresponding position of the first side surface 230 of the substrate 200, where the sensing chip 201 needs to be fixed. In such a way, the sensing chip 201 is adhered to the surface of the first adhesive layer 208, and the sensing chip 201 is fixed on the substrate 200.

A capacitor structure or an inductor structure is formed in the sensing region 211 for obtaining user fingerprint information, such that the sensing region 211 may detect and receive the user fingerprint information. In the embodiment, the sensing chip 201 further includes a peripheral region 212 located on the first surface 210 and surrounding the sensing region 211, and a chip circuit 215 is formed in the peripheral region 212 on the first surface 210 of the sensing chip 201. The chip circuit 215 is electrically connected to the capacitor structure or the inductor structure in the sensing region 211, and is configured to process an electrical signal outputted by the capacitor structure or the inductor structure.

In the embodiment, at least one capacitor plate is formed in the sensing region 211. When a user finger is put on a surface of the cover layer formed subsequently, a capacitor structure is formed by the capacitor plate, the cover layer and the user finger. The sensing region 211 may obtain a difference between: a capacitance between a ridge on a surface of the user finger and the capacitor plate, and a capacitance between a valley on the surface of the user finger and the capacitor plate, process the difference between the capacitances via the chip circuit 215, and output the difference between the capacitances, to obtain the user fingerprint data.

In the embodiment, the sensing chip 201 further includes an edge groove 204 located in the peripheral region 212. The edge groove 204 is exposed on a side wall of the sensing chip 201. A first pad 205 is formed at the bottom of the edge groove 204. The edge groove 204 is configured to form an output terminal of the chip circuit 215, i.e., the first pad 205. The first pad 205 can be electrically connected to the wiring layer of the substrate 200 by a subsequent wire bonding process.

In the embodiment, the chip circuit 215 located in the peripheral region 212 of the sensing chip 201 covers the side wall and the bottom surface of the edge groove 204. The chip circuit 215 located at the bottom of the edge groove 204 is connected to the first pad 205.

In an embodiment, the edge groove 204 is a continuous groove surrounding the sensing region 211, and one or several first pads 205 are provided on the bottom surface of the continuous edge groove 204. In another embodiment, the edge groove 204 includes several discrete grooves surrounding the sensing region 211. One or several first pads 205 are provided in each of the discrete grooves 204. The number and distribution of the first pads 205 are determined based on a specific circuit layout requirement of the chip circuit 215.

In the embodiment, the side wall of the edge groove 204 is inclined with respect to the surface of the sensing chip 201. An angle between the side wall and the bottom of the edge groove 204 is an obtuse angle. The inclined side wall of the edge groove 204 is advantageous for forming the chip circuit 215, i.e., the inclined side wall of the edge groove 204 is advantageous for performing a deposition process or an etching process to form the chip circuit 215 on the surface of the side wall of the edge groove 204.

Figure 4:
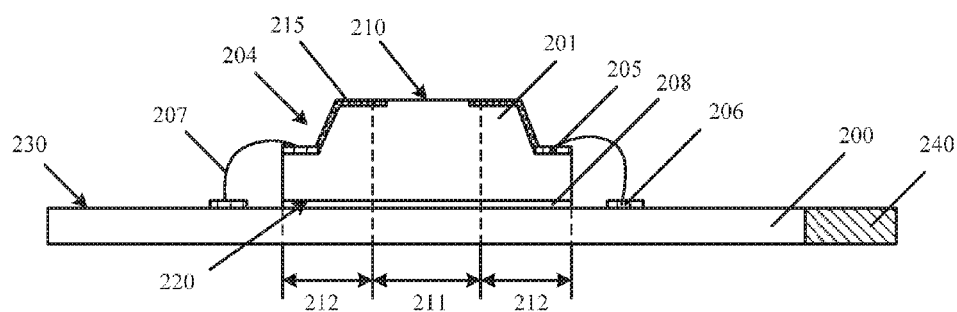

Reference is made to FIG. 4. The sensing chip 201 is coupled to the substrate 200.

Coupling the sensing chip 201 to the substrate 200 is to electrically connect the sensing chip 201 to the substrate 200.

In the embodiment, a conductive wire 207 is formed by a wire bonding process. Two ends of the conductive wire 207 are respectively connected to the first pad 205 and the second pad 206, which electrically connect the sensing chip 201 to the substrate 200. The conductive wire 207 may electrically connect the chip circuit 215 to the wiring layer on the substrate 200, and the wiring layer is electrically connected to a connection portion 240, such that the chip circuit 215 and the sensing region 211 on the surface of the sensing chip 201 can transmit an electrical signal with the external circuit or device. The conductive wire 207 is made of metal, such as copper, tungsten, aluminum, gold, or silver. By the wire bonding process, electrically connecting the sensing chip 201 to the substrate 200 is simple, and the cost of the process is low.

The wire bonding process includes: providing the conductive wire 207; and connecting two ends of the conductive wire 207 to the first pad 205 and the second pad 206 respectively by a soldering process. The conductive wire 207 is made of metal, such as copper, tungsten, aluminum, gold or silver.

The conductive wire 207 is wrapped by the plastic packaging layer, to electrically isolate the conductive wire 207 from the sensing chip 201, and to electrically isolate the conductive wire 207 from the external environment. Since the conductive wire 207 is connected between the first pad 205 and the second pad 206, the conductive wire 207 is bent. A point on the conductive wire 207 whose distance to the first side surface 230 of the substrate 200 is maximal is an apex. The apex is higher than the bottom surface of the edge groove 204 and lower than the first surface 210 of the sensing chip 201. Since the surface of the plastic packaging layer formed subsequently is flush with the first surface 210 of the sensing chip 201, the apex is lower than the surface of the subsequently formed plastic packaging layer, such that the subsequently formed plastic packaging layer may completely wrap the conductive wire 207, the conductive wire 207 may be electrically isolated from the sensing chip 201, and the conductive wire 207 is prevented from being exposed.

Figure 8:
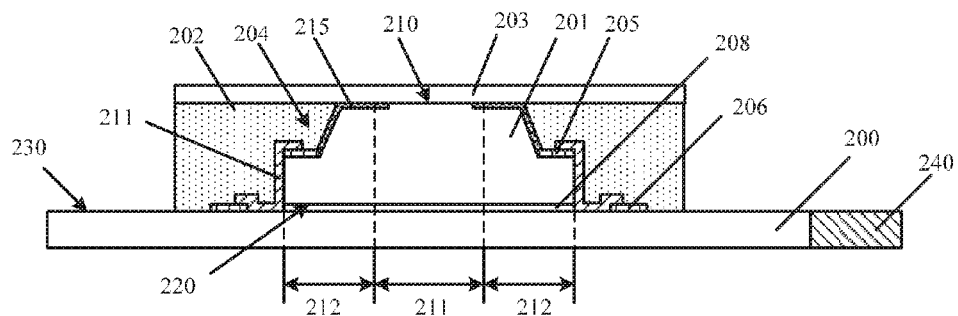

In another embodiment, a conductive layer 211 (as shown in FIG. 8) is formed on the surface of the side wall of the sensing chip 201, on the first side surface 230 of the substrate 200, and in the edge groove 204. Two ends of the conductive layer 211 are respectively connected to the first pad 205 and the second pad 206. A process for forming the conductive layer 211 includes forming a conductive film through a deposition process, a plating process, or an chemical plating process; and etching a part of the conductive film to form the conductive layer 211. The conductive layer 211 is made of metal, such as copper, tungsten, aluminum, silver, gold, titanium, tantalum, nickel, titanium nitride, tantalum nitride or any combination thereof.

Figure 5:
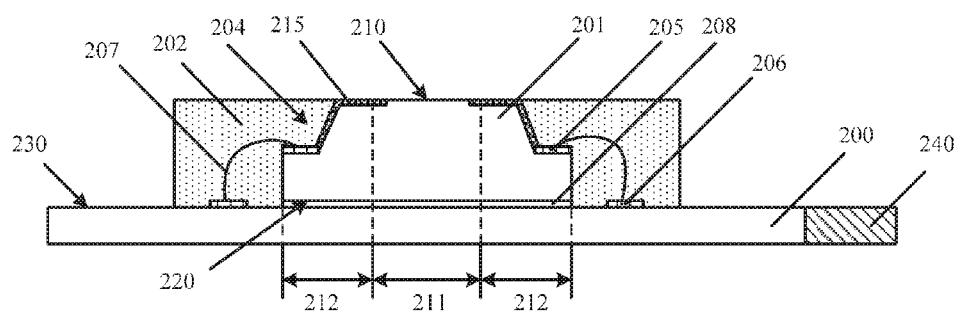

Reference is made to FIG. 5. A plastic packaging layer 202 is formed on the substrate 200. The plastic packaging layer 202 surrounds the sensing chip 201. The surface of the plastic packaging layer 202 is flush with the first surface 210 of the sensing chip 201.

The plastic packaging layer 202 is configured to fix and protect the sensing chip 201 and the conductive wire 207, electrically isolate the conductive wire 207 from the sensing chip 201, electrically isolate the conductive wire 207 from the external environment, and electrically isolate the sensing chip from the external environment.

In the embodiment, the apex of the conductive wire 207 is lower than the first surface 210 of the sensing chip 201, and the surface of the plastic packaging layer 202 is flush with the first surface 210 of the sensing chip 201. Therefore, the plastic packaging layer 202 is capable of completely wrapping the conductive wire 207.

The plastic packaging layer 202 is made of polymer. The polymer has good ductility, flexibility and covering power. The polymer includes epoxy resin, polyethylene, polypropylene, polyolefin, polyamide, polyurethane, or other suitable plastic package materials.

The plastic packaging layer 202 may be formed by an injection molding process, a transfer molding process, or a screen printing process. Since the injection molding process, the transfer molding process, or the screen printing process can form a plastic packaging layer 202 with a preset shape, the surface of the plastic packaging layer 202 can be made flush with the first surface 210 of the sensing chip 201 without performing an additional etching process or polishing process on the plastic packaging layer 202. Therefore, the damage to the first surface 210 of the sensing chip 201 is less, and the sensing region 211 can obtain more accurate fingerprint information.

Furthermore, since the surface of the plastic packaging layer 202 is flush with the first surface 210 of the sensing chip 201, the subsequently formed cover layer can be closely adhered to the plastic packaging layer 202 and the first surface 210 of the sensing chip 201 without performing an additional etching process on the cover layer. Therefore, the damage to the first surface 210 of the sensing chip 201 can be avoided, and a detected result obtained by the sensing region 211 of the sensing chip 201 is more accurate.

In addition, the plastic packaging layer 202 may be made of a material having an adhesive property. A part of the subsequently formed cover layer is located on the surface of the plastic packaging layer 202, thus the cover layer may be fixed by the plastic packaging layer 202. In such a way, the process for forming the package structure is more simple, and is advantageous for reducing a size of the package structure.

In the embodiment, since the peripheral region 212 of the sensing chip 201 is further provided with the edge groove 204, the plastic packaging layer 202 is located in the edge groove 204, and the plastic packaging layer 202 is flush with the surface of the sensing region 211 of the sensing chip 201.

Figure 6:
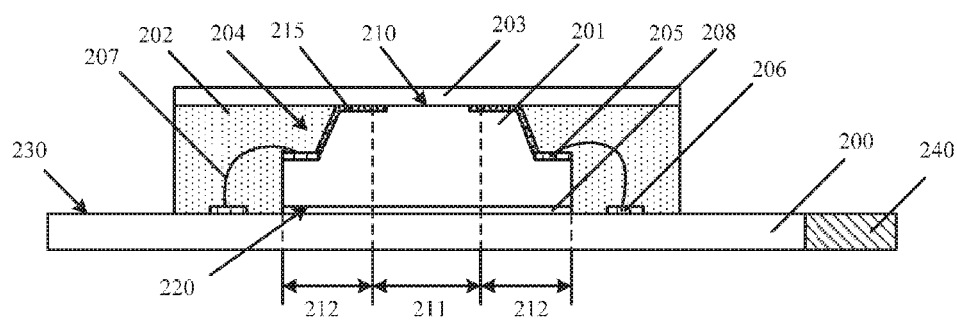

Reference is made to FIG. 6. The cover layer 203 is formed on the plastic packaging layer 202 and the first surface 210 of the sensing chip 201.

The cover layer 203 is configured to protect the sensing region 211. When a user finger is put on a surface of the cover layer 203 of the sensing region 211, the sensing region 211 may obtain the user fingerprint information.

The cover layer 203 has an Mohs hardness greater than or equal to 8H. The hardness of the cover layer 203 is high. Therefore, even if the cover layer 203 has a small thickness, the cover layer 203 is hard enough to protect the sensing region 211 of the sensing chip 201. If the user finger moves on the surface of the cover layer 203, the surface of the sensing chip 201 will not be damaged. In addition, the hardness of the cover layer 203 is high, thus the cover layer 203 scarcely deforms, and even if the user finger presses against the surface of the cover layer 203, the thickness of the cover layer 203 scarcely changes, thereby achieving the accuracy of a detection result of the sensing region 211.

The cover layer 203 has a dielectric constant greater than or equal to 7. Since the dielectric constant of the cover layer 203 is large, the cover layer 203 has a great capacity of electrical isolation, and thus the cover layer 203 may well protect the sensing region 211.

The cover layer 203 has a thickness ranging from 20 microns to 100 microns. The cover layer 203 has a small thickness, and a distance from a finger to the sensing region 211 is decreased if the user finger is put on a surface of the cover layer 203. Therefore, it is easier for the sensing region 211 to detect a user fingerprint, and the requirement for the sensitivity of the sensing chip 201 is lowered.

The thickness of the cover layer 203 is small, and the capacitance between the user finger and the capacitor plate are inversely proportional to the thickness of the cover layer 203, and are directly proportional to the dielectric constant of the cover layer 203. Therefore, if the cover layer 203 has a small thickness and a large dielectric constant, the capacitance between the user finger and the capacitor plate are within a range detectable by the sensing region 211, thereby avoiding detection failure of the sensing region 211 due to too large or too small capacitances.

In addition, if the cover layer 203 has a thickness ranging from 20 microns to 100 microns and a dielectric constant greater than or equal to 7, the dielectric constant of the cover layer 203 increases as the thickness of the cover layer 203 increases, the capacitance between the user finger and the capacitor plate is large, and the capacitance is easy to be detected by the sensing region 211.

The cover layer 203 is made of a polymer material, an inorganic nanometer material, or a ceramic material. In the embodiment, the cover layer 203 is made of an inorganic nanometer material. The inorganic nanometer material includes aluminium oxide or cobalt oxide. The cover layer 203 is formed by a chemical vapor deposition process, a physical vapor deposition process, an atomic layer deposition process, a screen printing process, a spin coating process, or a spray coating process.

In the embodiment, the cover layer 203 is made of an inorganic nanometer material. The inorganic nanometer material may be formed by a spray coating process or a spin coating process. Forming the cover layer 203 by using the inorganic nanometer material can make the cover layer 203 have a small thickness, thereby enhancing the sensing ability of the sensing chip 201 with regard to the user fingerprint, and reducing the requirement for the sensitivity of the sensing chip 201.

In another embodiment, the cover layer 203 is made of polymer. The polymer is epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol or other suitable polymers. The cover layer 203 may be formed by a printing process, a spray coating process, or a spin coating process.

In the embodiment, after the cover layer 203 is formed by a chemical vapor deposition process, a physical vapor deposition process, an atomic layer deposition process, a screen printing process, a spin coating process, or a spray coating process, the cover layer 203 is etched, and a part of the cover layer 203 on the substrate 200 is removed, such that the cover layer is only located on the surface of the plastic packaging layer 202 and the sensing chip 201.

The color of the cover layer 203 may be identical with the color of a guard ring or of a housing which is set subsequently, such that the formed package structure has an attractive appearance and a uniform color. In the embodiment, the color of the cover layer 203 includes black or white. In another embodiment, the cover layer 203 may be other colors.

In another embodiment, the process of etching the cover layer on the substrate 200 may be omitted, such that the formed cover layer is further located on the first side surface 230 of the substrate 200 and on the surface of the side wall of the plastic packaging layer 202, thereby simplifying the process of forming the cover layer.

Figure 7:
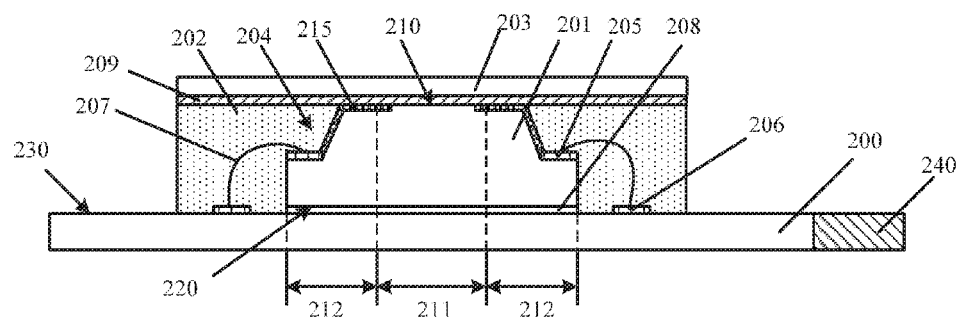
FIG. 7 to FIG. 11 are sectional views of a package structure for a fingerprint identification chip according to other embodiments of the present disclosure.

In another embodiment, a second adhesive layer 209 (as shown in FIG. 7) is formed on the plastic packaging layer 202 and the first surface of the sensing chip 201, and the cover layer 203 is formed on the surface of the second adhesive layer 209. The second adhesive layer 209 is configured to fix the cover layer 203 on the plastic packaging layer 202 and the first surface 210 of the sensing chip 201. In the embodiment, the cover layer 203 is made of material having poor ductility and poor flexibility, such as a ceramic substrate or a glass substrate. The surface of the second adhesive layer 209 is adhesive. The cover layer 203 may be adhered to the surfaces of the plastic packaging layer 202 and the sensing chip 201 by adhering the second adhesive layer 209 to the surface of the cover layer 203.

In a case that the cover layer 203 is a glass substrate, a dielectric constant of the glass substrate ranges from 6 to 10. In a case that the cover layer 203 is a ceramic substrate, the ceramic substrate has a dielectric constant ranging from 20 to 100 and a thickness ranging from 100 microns to 200 microns.

In addition, a color of the second adhesive layer 209 includes black or white. In another embodiment, a color layer is formed on the surface of the second adhesive layer. The cover layer is formed on a surface of the color layer. The color of the color layer includes black or white. In another embodiment, the color layer may be other colors.

Figure 9:
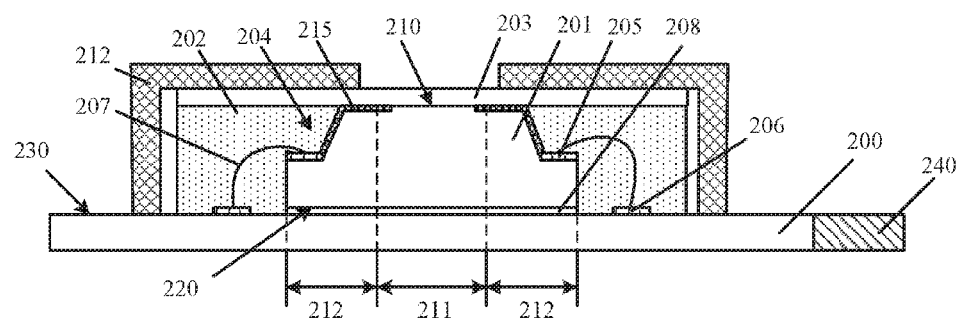

In another embodiment, reference is made to FIG. 9. The packaging method for a fingerprint identification chip further includes forming a guard ring 212 on the substrate 200. The guard ring 212 surrounds the sensing chip 201, the packaging layer 202 and the cover layer 203. The guard ring 212 is made of metal and is grounded via the substrate 200. The guard ring 212 is fixed on the first side surface 230 of the substrate 200.

In the embodiment, the guard ring 212 is located around the sensing chip 201, the cover layer 203 and the plastic packaging layer 202. A part of the guard ring 212 extends over the cover layer 203, and a part of the surface of the cover layer 203 above the sensing region 211 is exposed from the guard ring 212. In another embodiment, the guard ring is only located around the sensing chip 201 and the plastic packaging layer 202, and the surface of the cover layer 203 is completely exposed from the guard ring 212.

The guard ring 212 is made of metal, such as copper, tungsten, aluminum, silver or gold. The guard ring 212 is configured to provide electrostatic protection to the sensing chip 201. Since the guard ring 212 is made of metal, the guard ring 212 is conductive. Static electricity is generated when the user finger touches the cover layer 203, and electrostatic charges are preferentially transferred to the substrate 200 via the guard ring 212, thereby preventing the cover layer 203 from being broken down by a too large electrostatic voltage. In this way, the sensing chip 201 is protected, and accuracy of fingerprint detection is improved. Signal noise outputted by the sensing chip is eliminated, and thus a signal outputted by the sensing chip is more accurate.

Figure 10:
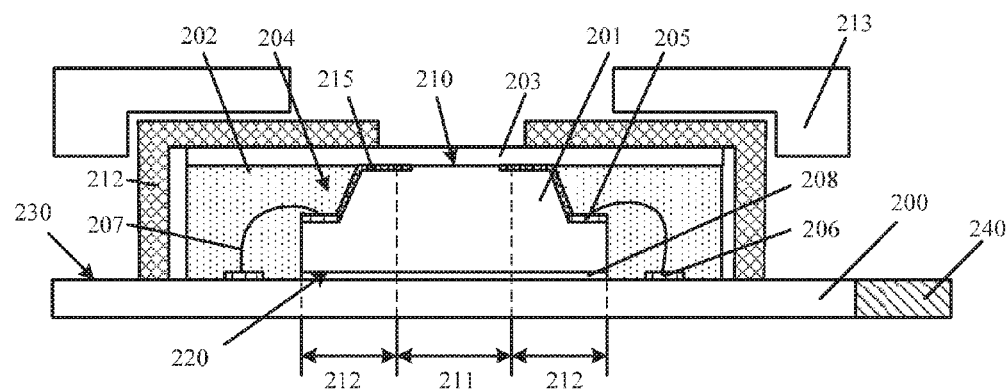

In another embodiment, reference is made to FIG. 10. The packaging method for a fingerprint identification chip further includes forming a housing 213 surrounding the plastic packaging layer 202, the sensing chip 201, the cover layer 203 and the guard ring 212. The cover layer 203 on the surface of the sensing region 201 is completely exposed from the housing 213. The housing 213 may be a housing of a device or a terminal in which a fingerprint identification chip is to be arranged, or may be a housing of the package structure for the fingerprint identification chip.

Figure 11:
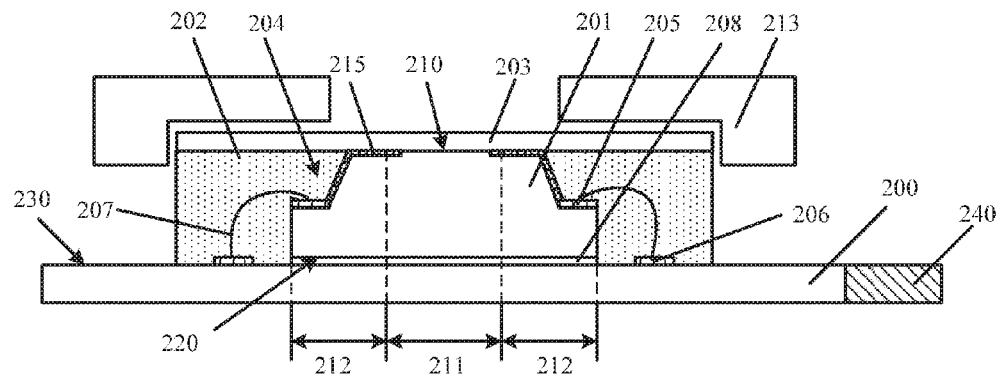

In another embodiment, reference is made to FIG. 11. The packaging method for a fingerprint identification chip further includes forming a housing 213 surrounding the plastic packaging layer 202, the sensing chip 201 and the cover layer 203. The cover layer 203 on the surface of the sensing region 211 is exposed from the housing 213.

In view of the above, in the packaging method for a fingerprint identification chip, the surface of the plastic packaging layer formed on the substrate is flush with the first surface of the sensing chip, and the plastic packaging layer is configured to protect the sensing chip and electrically isolate the sensing chip from the external environment. Since the surface of the plastic packaging layer is flush with the first surface of the sensing chip, the cover layer can be directly formed on the plastic packaging layer and the first surface of sensing chip without performing an additional patterning process on the cover layer. In such a way, the process of forming the cover layer is simplified, unwanted damage to a sensing region of the sensing chip in the process of forming the cover layer can be avoided, such that fingerprint data obtained by the sensing region is accurate. The cover layer replaces the conventional glass substrate and can be touched by a user finger directly to protect the sensing chip. In addition, the cover layer can be thinner than conventional glass substrates, and the use of the cover layer can reduce a distance from the first surface of the sensing chip to a surface of the cover layer, such that it is easy for the sensing chip to detect a user fingerprint. Accordingly, the package structure reduces the requirement for sensitivity of a sensitive chip, and the package structure for a fingerprint identification chip is widely used.

Accordingly, a package structure formed by the above method is further provided according to an embodiment of the present disclosure. Reference is made to FIG. 6. The package structure includes a substrate 200, a sensing chip 201 coupled to the substrate 200, a plastic packaging layer 202 located on the substrate 200, and a cover layer 203 located on the plastic packaging layer 202 and the first surface 210 of the sensing chip 201. The sensing chip 201 includes a first surface 210, and a second surface 220 opposite to the first surface 210. The sensing chip 201 further includes a sensing region 211 located on the first surface 210, and the second surface 220 of the sensing chip 201 faces the substrate 200. The plastic packaging layer 202 surrounds the sensing chip 201, and the surface of the plastic packaging layer 202 is flush with the first surface 210 of the sensing chip 201. A thickness of the cover layer 203 is smaller than 100 microns.

Hereinafter the package structure for a fingerprint identification chip will be described in detail.

The sensing region 211 located on the first surface 210 of the sensing chip 201 is configured to detect and receive user fingerprint information. A capacitor structure or an inductor structure is provided in the sensing region 211 for obtaining the user fingerprint information.

In the embodiment, the sensing chip 201 further includes a peripheral region 212 located on the first surface 210 and surrounding the sensing region 211. The peripheral region 212 of the sensing chip 201 is provided with a chip circuit 215. The chip circuit 215 is electrically connected to the capacitor structure or the inductor structure in the sensing region 211 and is configured to process an electrical signal outputted by the capacitor structure or the inductor structure.

In the embodiment, the sensing region 211 is provided with at least one capacitor plate. When a user finger is put on a surface of the cover layer 203, a capacitor structure is formed by the capacitor plate, the cover layer 203 and the user finger. The sensing region 211 may obtain a difference between: a capacitance between a ridge on a surface of the user finger and the capacitor plate, and a capacitance between a valley on the surface of the user finger and the capacitor plate, process the difference between the capacitances via the chip circuit 215, and output the difference between the capacitances, to obtain user fingerprint data.

The sensing chip 201 further includes an edge groove 204 located in the peripheral region 212. The edge groove 204 is exposed from a side wall of the sensing chip 201. A first pad 205 is provided at the bottom of the edge groove 204. The edge groove 204 is configured to form an output terminal of the chip circuit 215, i.e., the first pad 205. The first pad 205 is electrically connected to the substrate 200, thereby coupling the sensing chip 201 to the substrate 200.

In the embodiment, the chip circuit 215 located in the peripheral region 212 of the sensing chip 201 covers the side wall and the bottom surface of the edge groove 204. The chip circuit 215 located at the bottom of the edge groove 204 is connected to the first pad 205.

In another embodiment, the edge groove 204 is a continuous groove surrounding the sensing region 211, and one or several first pads 205 are provided on the surface of the bottom of the continuous edge groove 204. In another embodiment, the edge groove 204 includes several discrete grooves surrounding the sensing region 211. One or several first pads 205 are provided in each of the discrete grooves 204. The number and distribution of the first pads 205 are determined based on a specific circuit layout requirement of the chip circuit 215.

In the embodiment, the side wall of the edge groove 204 is inclined with respect to the surface of the sensing chip 201. An angle between the side wall and the bottom of the edge groove 204 is an obtuse angle. The surface of the inclined side wall of the edge groove 204 is advantageous for forming the chip circuit 215 and for performing a deposition process or an etching process of forming the chip circuit 215.

The substrate 200 is configured to fix the sensing chip 201 and electrically connect the sensing chip 201 to other devices or circuits. In the embodiment, the package structure for a fingerprint identification chip further includes a first adhesive layer 208 located between the sensing chip 201 and the substrate 200. The sensing chip 201 is fixed on the substrate 200 via the first adhesive layer 208.

The substrate 200 is a rigid substrate or a flexible substrate, and may be adjusted for a device or a terminal in which the sensing chip 201 is to be arranged. In the embodiment, the substrate 200 is a rigid substrate. The rigid substrate is a PCB substrate, a glass substrate, a metal substrate, a semiconductor substrate or a polymer substrate.

The substrate 200 includes a first side surface 230, and the sensing chip 201 is coupled to the first side surface 230 of the substrate 200. The first side surface 230 of the substrate 200 is provided with a wiring layer (not shown) and a second pad 206. The wiring layer is connected to the second pad 206, and the second pad 206 is configured to be connected to a chip circuit 215 on the first surface 210 of the sensing chip 201.

In the embodiment, a connection portion 204 is provided on one end of the substrate 200. The connection portion 204 is made of a conductive material. The connection portion 204 is electrically connected to the wiring layer, so that the chip circuit 215 on the sensing chip 201 may be electrically connected to the external circuit or a external device via the wiring layer on the first side surface 230 of the substrate 200 and via the connection portion 204, thereby achieving transmission of an electrical signal.

In the embodiment, the package structure for a fingerprint identification chip further includes a conductive wire 207. Two ends of the conductive wire 207 are respectively connected to the first pad 205 and the second pad 206, such that the wiring layer is electrically connected to the connection portion 240. Therefore, the chip circuit and the sensing region 211 on the surface of the sensing chip 201 can transmit an electrical signal with the external circuit or device. The conductive wire 207 is made of metal, such as copper, tungsten, aluminum, gold, or silver.

The conductive wire 207 is wrapped by the plastic packaging layer, to electrically isolate the conductive wire 207 from the sensing chip 201, and to electrically isolate the conductive wire 207 from the external environment. Since the conductive wire 207 is connected between the first pad 205 and the second pad 206, the conductive wire 207 is bent. A point on the conductive wire 207 whose distance to the first side surface 230 of the substrate 200 is maximal is an apex. The apex is higher than the bottom surface of the edge groove 204 and lower than the first surface 210 of the sensing chip 201. Since the surface of the plastic packaging layer 202 is flush with the first surface 210 of the sensing chip 201, the plastic packaging layer 202 may completely wrap the conductive wire 207, and the conductive wire 207 is prevented from being exposed.

The plastic packaging layer 202 is located on the substrate 200 and surrounds the sensing chip 201 and the conductive wire 207. The plastic packaging layer 202 is configured to fix the sensing chip 201 on the first side surface 230 of the substrate 200, electrically isolate the conductive wire 207 from the sensing chip 201, and electrically isolate the conductive wire 207 from the external environment.

The plastic packaging layer 202 is made of polymer. The polymer has good ductility, flexibility and covering power. The polymer includes epoxy resin, polyethylene, polypropylene, polyolefin, polyamide, polyurethane, or other suitable plastic packaging materials. The plastic packaging layer 202 may be formed by an injection molding process, a transfer molding process, or a screen printing process.

In the embodiment, the surface of the plastic packaging layer 202 can be flush with the first surface 210 of the sensing chip 201, such that the cover layer 203 directly covers on the plastic packaging layer 202 and the first surface 210 of the sensing chip 201. In this way, the formed fingerprint identification chip has a simple structure and is easy to assemble.

Furthermore, since a part of the cover layer 203 is located on the surface of the plastic packaging layer 202, the plastic packaging layer 202 can be used to fix the cover layer 203 and to make the cover layer 203 closely adhered to the first surface 210 of the sensing chip 201. Therefore, the damage to the first surface 210 of the sensing chip 201 can be avoided, and a detected result obtained by the sensing region 211 of the sensing chip 201 may be more accurate.

In the embodiment, since the peripheral region 212 of the sensing chip 201 is further provided with the edge groove 204, the plastic packaging layer 202 is located in the edge groove 204, and the plastic packaging layer 202 is flush with the surface of the sensing region 211 of the sensing chip 201.

The cover layer 203 is made of a polymer material, an inorganic nanometer material, or a ceramic material. In the embodiment, the cover layer 203 is made of an inorganic nanometer material. The inorganic nanometer material includes aluminium oxide or cobalt oxide. The cover layer 203 may be formed by a printing process, a spray coating process, or a spin coating process.

In another embodiment, the cover layer 203 is made of polymer. The polymer is epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol or other suitable polymers. The cover layer 203 may be formed by a printing process, a spray coating process, or a spin coating process.

The cover layer 203 has an Mohs hardness greater than or equal to 8H. The hardness of the cover layer 203 is large. Therefore, even if the cover layer 203 has a small thickness, the cover layer 203 is hard enough to protect the sensing region 211 of the sensing chip 201. If the user finger moves on the surface of the cover layer 203, the surface of the sensing chip 201 will not be damaged. In addition, the hardness of the cover layer 203 is large, thus the cover layer 203 scarcely deforms, and even if the user finger presses against the surface of the cover layer 203, the thickness of the cover layer 203 scarcely changes, thereby achieving the accuracy of a detection result of the sensing region 211.

The cover layer 203 has a dielectric constant greater than or equal to 7. Since the dielectric constant of the cover layer 203 is large, the cover layer 203 has a great capacity of electrical isolation, and thus the cover layer 203 well protects the sensing region 211.

The cover layer 203 has a thickness ranging from 20 microns to 100 microns. The cover layer 203 has a small thickness, and a distance from a finger to the sensing region 211 is decreased in a case that the user finger is put on a surface of the cover layer 203. Therefore, it is easier for the sensing region 211 to detect a user fingerprint, and the requirement for the sensitivity of the sensing chip 201 is lowered.

The thickness of the cover layer 203 is small, and the capacitance between the user finger and the capacitor plate is inversely proportional to the thickness of the cover layer 203, and is directly proportional to the dielectric constant of the cover layer 203. Therefore, if the cover layer 203 has a small thickness and a large dielectric constant, the capacitance between the user finger and the capacitor plate are within a range detectable by the sensing region 211, thereby avoiding detection failure of the sensing region 211 due to a too large or too small capacitance.

In addition, in a case that the cover layer 203 has a thickness ranging from 20 microns to 100 microns and a dielectric constant greater than or equal to 7, the dielectric constant of the cover layer 203 increases as the thickness of the cover layer 203 increases, such that the capacitance between the user finger and the capacitor plate is large, and the capacitance is easy to be detected by the sensing region 211.

The color of the cover layer 203 may be identical with the color of a guard ring or of a housing which is set subsequently, such that the formed package structure has an attractive appearance and a uniform color. In the embodiment, the color of the cover layer 203 includes black or white. In another embodiment, the cover layer 203 may be other colors.

Reference is made to FIG. 7. In another embodiment, the package structure for a fingerprint identification chip further includes a second adhesive layer 209 between the cover layer 203 and the packaging layer 202 and between the cover layer 203 and the first surface 210 of the sensing chip 201. In the embodiment, the cover layer 203 is made of a material having poor ductility and flexibility, such as a ceramic substrate or a glass substrate. The second adhesive layer 209 is configured to fix the cover layer 203 on the plastic packaging layer 202 and on the first surface 210 of the sensing chip 201.

In a case that the cover layer 203 is a glass substrate, the glass substrate has a dielectric constant ranging from 6 to 10 and a thickness ranging from 100 microns to 300 microns. In a case that the cover layer 203 is a ceramic substrate, the ceramic substrate has a dielectric constant ranging from 20 to 100 and a thickness ranging from 100 microns to 200 microns.

In addition, the color of the second adhesive layer 209 includes black or white. In another embodiment, a color layer is formed on the surface of the second adhesive layer. The cover layer is formed on a surface of the color layer. The color of the color layer includes black or white. In another embodiment, the color layer may be other colors.

In another embodiment, reference is made to FIG. 8. The package structure for a fingerprint identification chip further includes a conductive layer 211 located on the surface of the side wall of the sensing chip 201, on the first side surface 230 of the substrate 200, and in the edge groove 204. Two ends of the conductive layer 211 are respectively connected to the first pad 205 and the second pad 206, so as to electrically connect the sensing region 211 and the chip circuit 215 to the wiring layer on the substrate 200.

In another embodiment, reference is made to FIG. 9. The package structure for a fingerprint identification chip further includes a guard ring 212 located on the substrate 200. The guard ring 212 surrounds the sensing chip 201, the packaging layer 202 and the cover layer 203.

The guard ring 212 is made of metal and is grounded via the substrate 200. The guard ring 212 is fixed on the first side surface 230 of the substrate 200.

In the embodiment, the guard ring 212 is located around the sensing chip 201, the cover layer 203 and the plastic packaging layer 202. A part of the guard ring 212 extends over the cover layer 203, and a part of the surface of the cover layer 203 above the sensing region 211 is exposed from the guard ring 212. In another embodiment, the guard ring is only located around the sensing chip 201 and the plastic packaging layer 202, and the surface of the cover layer 203 is completely exposed from the guard ring 212.

The guard ring 212 is made of metal, such as copper, tungsten, aluminum, silver or gold. The guard ring 212 is configured to provide electrostatic protection for the sensing chip 201. Since the guard ring 212 is made of metal, the guard ring 212 is conductive. Static electricity is generated when the user finger touches the cover layer 203, and electrostatic charges are preferentially transferred to the substrate 200 via the guard ring 212, thereby preventing the cover layer 203 from being broken down due to a too large electrostatic voltage. In this way, the sensing chip 201 is protected, and accuracy of fingerprint detection is improved. Signal noise outputted by the sensing chip is eliminated, and thus a signal outputted by the sensing chip is more accurate.

In another embodiment, reference is made to FIG. 10. The package structure for a fingerprint identification chip further includes a housing 213 surrounding the plastic packaging layer 202, the sensing chip 201, the cover layer 203 and the guard ring 212. The cover layer 203 on the surface of the sensing region 211 is exposed from the housing 213. The housing 213 may be a housing of a device or a terminal in which the fingerprint identification chip is to be arranged, or may be a housing of the package structure for the fingerprint identification chip.

In another embodiment, reference is made to FIG. 11. The package structure for a fingerprint identification chip further includes a housing 213 surrounding the plastic packaging layer 202, the sensing chip 201 and the cover layer 203. The cover layer 203 on the surface of the sensing region 211 is exposed from the housing 213.

Compared with the conventional technology, the technical solutions of the present disclosure have the following advantages.

In the packaging method according to the present disclosure, the surface of the plastic packaging layer formed on the substrate is flush with the first surface of the sensing chip, and the plastic packaging layer is configured to protect the sensing chip and electrically isolate the sensing chip from the external environment. Since the surface of the plastic packaging layer is flush with the first surface of the sensing chip, the cover layer can be directly formed on the plastic packaging layer and the first surface of sensing chip without performing an additional patterning process on the cover layer. In such a way, the process of forming the cover layer is simplified, and unwanted damage to a sensing region of the sensing chip can be avoided in the process of forming the cover layer, such that fingerprint data obtained by the sensing region is accurate. The cover layer replaces the conventional glass substrate and can be touched by a user finger directly to protect the sensing chip. In addition, the cover layer can be thinner than conventional glass substrates, and the use of the cover layer can reduce a distance from the first surface of the sensing chip to a surface of the cover layer, such that it is easy for the sensing chip to detect a user fingerprint. Accordingly, the package structure reduces the requirement for sensitivity of a sensitive chip, such that the package structure for a fingerprint identification chip is widely used.

Further, the cover layer has a thickness ranging from 20 microns to 100 microns. The cover layer has a small thickness, such that it is easy for the sensing region of the sensing chip to detect a user fingerprint on the surface of the cover layer, thereby reducing the requirement for the sensitivity of the sensing chip. In a case that the hardness of the cover layer is large, the cover layer is hard enough to protect the first surface of the sensing chip even if the cover layer has a small thickness.

Further, the Mohs hardness of the cover layer is greater than or equal to 8H. The hardness of the cover layer is large, and even if the cover layer located on the surface of the sensing region has a small thickness, the cover layer still has sufficient strength to protect the sensing region. When the user finger is put on the surface of the cover layer on the sensing region, the cover layer is not subject to deformation or abrasion, such that a result of extracting the user fingerprint is more accurate.

Further, the covering layer has a dielectric constant ranging from 7 to 9. The cover layer has a large dielectric constant, such that electrical isolation performance of the cover layer is better, and the cover layer protects the sensing region better. Even if the cover layer on the surface of the sensing region has a small thickness, electrical isolation between the user finger and the sensing region is strong, and a capacitance formed between the user finger and the sensing region is large and is within a detectable range.

Further, the substrate is provided with the guard ring, and the guard ring surrounds the sensing chip and the cover layer. The guard ring is configured to perform static protection on the sensing chip, so as to prevent the accuracy of user fingerprint data detected by the sensing region from decreasing. The guard ring is further configured to eliminate signal noise outputted by the sensing chip, such that the data detected by the sensing chip and a signal outputted by the sensing chip are more accurate.

In the package structure of the present disclosure, the surface of the substrate surrounds the plastic packaging layer of the sensing chip, and the plastic packaging layer and the first surface of the sensing chip are provided with the cover layer. The plastic packaging layer is configured to fix the cover layer and make the cover layer directly adhered to the first surface of the sensing chip. The cover layer replaces the conventional glass substrate and can be touched by a user finger directly to protect the sensing chip. In addition, compared with conventional glass substrates, the cover layer has a small thickness and a high hardness, and even if the cover layer is thin, the cover layer is hard enough to protect the first surface of the sensing chip. The use of the cover layer can reduce a distance from the first surface of the sensing chip to a surface of the cover layer, such that it is easy for the sensing chip to detect a user fingerprint. Accordingly, the package structure reduces the requirement for sensitivity of a sensitive chip, such that the package structure for a fingerprint identification chip is widely used. Furthermore, the structure is simple and is easy to assemble, and the production cost is reduced.

In conclusion, in the package structure of the present disclosure, the surface of the substrate surrounds the plastic packaging layer of the sensing chip, and the plastic packaging layer and the first surface of the sensing chip are provided with the cover layer. The plastic packaging layer is configured to fix the cover layer and make the cover layer directly adhered to the first surface of the sensing chip. The cover layer replaces the conventional glass substrate and can be touched by a user finger directly to protect the sensing chip. In addition, compared with conventional glass substrates, the cover layer has a small thickness and a high hardness, and even if the cover layer is thin, the cover layer is hard enough to protect the first surface of the sensing chip. The use of the cover layer can reduce a distance from the first surface of the sensing chip to a surface of the cover layer, such that it is easy for the sensing chip to detect a user fingerprint. Accordingly, the package structure reduces the requirement for sensitivity of a sensitive chip, such that the package structure for a fingerprint identification chip is widely used. Furthermore, the structure is simple and is easy to assemble, and the production cost is reduced.

Although the present disclosure is disclosed above, the application is not limited thereto. Various changes and modifications can be made by those skilled in the art without departing from the spirit and scope of the present disclosure. Therefore, the protection scope of the present disclosure is defined by the claims.

The invention claimed is:

1. A chip package structure, comprising:
a substrate;
a sensing chip coupled to the substrate, wherein the sensing chip comprises:
  a first surface;
  a second surface opposite to the first surface, wherein the second surface of the sensing chip faces the substrate;
  a sensing region located on the first surface;
  a peripheral region located on the first surface and surrounding the sensing region;
  an edge groove located in the peripheral region, wherein the edge groove is exposed on a side surface of the sensing chip; and
  a chip circuit located on a surface of the peripheral region of the sensing chip and on a side wall and a bottom surface of the edge groove, wherein the chip circuit is configured to process an electrical signal outputted by a capacitor structure or an inductor structure in the sensing region;
a plastic packaging layer located on the substrate, wherein the plastic packaging layer surrounds the sensing chip, and the surface of the plastic packaging layer is flush with the first surface of the sensing chip; and
a cover layer located on the plastic packaging layer and the first surface of the sensing chip.

2. The chip package structure according to claim 1, wherein the plastic packaging layer is further located in the edge groove, and is flush with a surface of the sensing region of the sensing chip.

3. The chip package structure according to claim 1, further comprising a first pad located at the bottom of the edge groove, wherein the chip circuit is electrically connected to the first pad.

4. The chip package structure according to claim 3, wherein the substrate comprises a first side surface, the first side surface of the substrate is provided with a second pad, and the sensing chip is coupled to the second pad.

5. The chip package structure according to claim 1, wherein the substrate is provided with a connection portion, and the connection portion is configured to electrically connect the sensing chip to an external circuit.

6. The chip package structure according to claim 4, further comprising a conductive wire, wherein two ends of the conductive wire are connected to the first pad and the second pad respectively, a point on the conductive wire whose distance to the first side surface of the substrate is maximal is an apex, and the apex is lower than the surface of the plastic packaging layer.

7. The chip package structure according to claim 4, further comprising a conductive layer located on the surface of the side wall of the sensing chip, on the first side surface of the substrate, and in the edge groove, wherein two ends of the conductive layer are electrically connected to the first pad and the second pad respectively.

8. The chip package structure according to claim 1, wherein a thickness of the cover layer ranges from 20 microns to 100 microns, an Mohs hardness of the cover layer is greater than or equal to 8H, and a dielectric constant of the cover layer is greater than or equal to 7.

9. The chip package structure according to claim 1, wherein the cover layer is made of at least one of an inorganic nanometer material or a polymer material.

10. The chip package structure according to claim 9, wherein the polymer material comprises at least one of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer and polyvinyl alcohol.

11. The chip package structure according to claim 9, wherein the inorganic nanometer material comprises at least one of aluminium oxide and cobalt oxide.

12. The chip package structure according to claim 1, wherein the cover layer comprises a glass substrate, and the glass substrate has a dielectric constant ranging from 6 to 10 and a thickness ranging from 100 microns to 300 microns; or the cover layer comprises a ceramic substrate, and the ceramic substrate has a dielectric constant ranging from 20 to 100 and a thickness ranging from 100 microns to 200 microns.

13. The chip package structure according to claim 1, wherein the plastic packaging layer is made of polymer.

14. The chip package structure according to claim 13, wherein the polymer comprises at least one of epoxy resin, polyethylene, polypropylene, polyolefin, polyamide, and polyurethane.

15. The chip package structure according to claim 1, further comprising a guard ring on the substrate, wherein the guard ring surrounds the sensing chip, the plastic packaging layer and the cover layer, and a part of the cover layer over the sensing region is exposed from the guard ring.

16. The chip package structure according to claim 15, further comprising a housing surrounding the plastic packaging layer, the sensing chip and the cover layer, wherein a part of the cover layer over the sensing region is exposed from the housing.

* * * * *